(12) United States Patent
Bae

(10) Patent No.: US 8,300,482 B2
(45) Date of Patent: Oct. 30, 2012

(54) DATA TRANSFER CIRCUIT AND SEMICONDUCTOR MEMORY DEVICE INCLUDING THE SAME

(75) Inventor: Ji-Hyae Bae, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1000 days.

(21) Appl. No.: 12/326,985

(22) Filed: Dec. 3, 2008

(65) Prior Publication Data

US 2009/0322770 A1    Dec. 31, 2009

(30) Foreign Application Priority Data

Jun. 30, 2008  (KR) ........................ 10-2008-0063187

(51) Int. Cl.
*G11C 7/00* (2006.01)
(52) U.S. Cl. .............. 365/191; 365/230.01; 365/230.08; 365/189.05; 365/230.06; 365/233.1
(58) Field of Classification Search .................. 365/191, 365/230.01, 230.08, 189.05, 230.06, 233.1
See application file for complete search history.

(56) References Cited

U.S. PATENT DOCUMENTS

2005/0240744 A1   10/2005  Shaikh et al.
2008/0219064 A1*  9/2008   Yoon ........................ 365/189.16
2008/0225603 A1*  9/2008   Hein ........................ 365/189.05
2010/0228891 A1*  9/2010   Talbot ............................ 710/14

FOREIGN PATENT DOCUMENTS

KR    1020070027539 A    3/2007
KR    1020090023815 A    3/2009

OTHER PUBLICATIONS

Notice of Allowance issued from Korean Intellectual Property Office on Jan. 26, 2010.
H5GQ5223MJR, Rev. 01 / May 2008.
GDDR5 SGRAM Specification AMD Confidential rev 0.75.

* cited by examiner

*Primary Examiner* — Vu Le
*Assistant Examiner* — Han Yang
(74) *Attorney, Agent, or Firm* — IP & T Group LLP

(57) ABSTRACT

A data transfer circuit has a reduced number of lines for transferring a training pattern used in a read training for high speed operation, by removing a register for temporarily storing the training pattern, and a semiconductor memory device including the data transfer circuit. The data transfer circuit includes a latch unit and a buffer unit. The latch unit latches one bit of a training pattern data input together with a training pattern load command whenever the training pattern load command is input. The buffer unit loads a plurality of bits latched in the latch unit, including the one bit of training pattern data, in response to a strobe signal.

21 Claims, 13 Drawing Sheets

FIG. 7
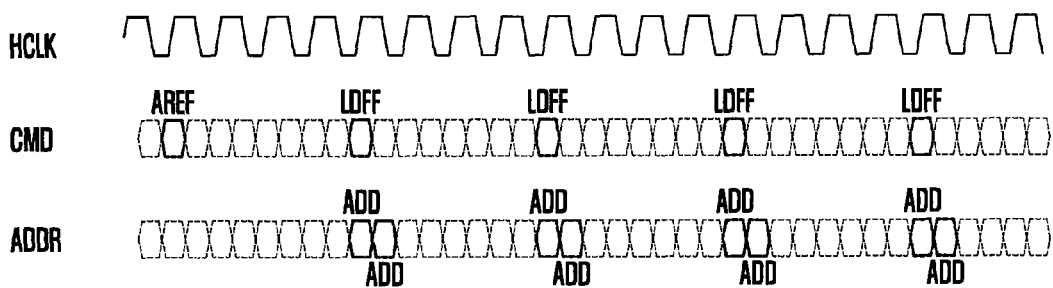
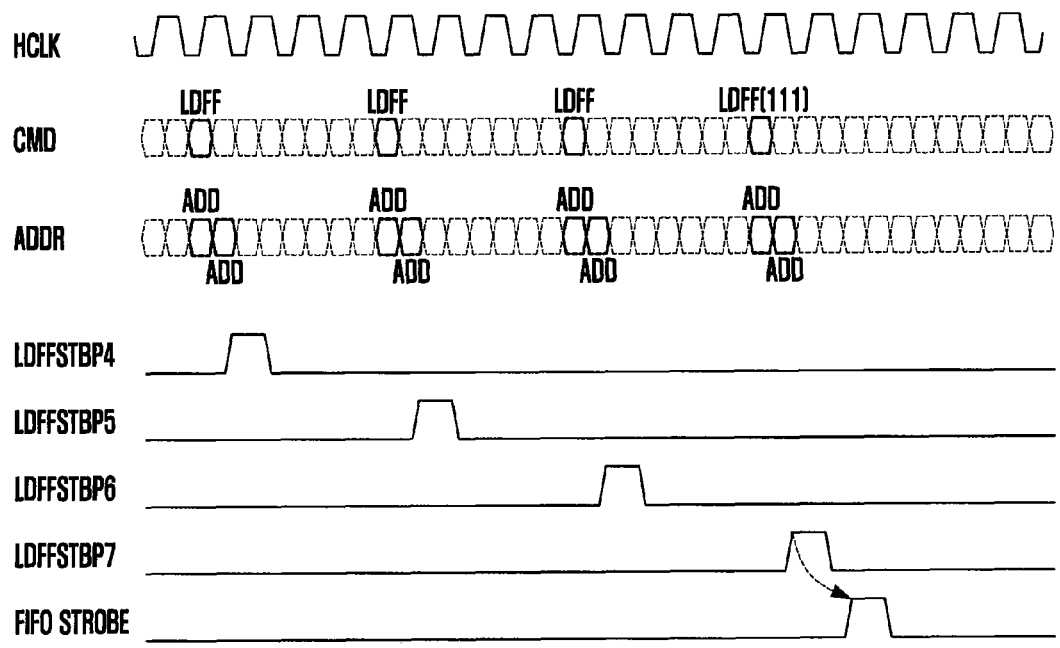

DATA TRANSFER CIRCUIT AND SEMICONDUCTOR MEMORY DEVICE INCLUDING THE SAME

CROSS-REFERENCE(S) TO RELATED APPLICATIONS

The present invention claims priority of Korean patent application number 10-2008-0063187, filed on Jun. 30, 2008, which is incorporated by reference in its entirety.

BACKGROUND OF THE INVENTION

The present invention relates to a data transfer circuit, and more particularly, to a data transfer circuit with a simple configuration and a semiconductor memory device including the data transfer circuit.

When a read command is input from a data processor, such as a central processing unit (CPU) or a graphic processing unit (GPU), a semiconductor memory device outputs data stored in a cell corresponding to an address which is input from the data processor. In addition, when a write command is input from the data processor, the semiconductor memory device stores data in a cell corresponding to an address which is input from the data processor. Such read and write operations of the semiconductor memory device are performed at a high speed.

In general, as the speed of performing the read and write operations increases, the semiconductor memory device is considered to have better operating performance. Particularly, in a semiconductor memory device for processing a large quantity of data such as image data, the speed of outputting the data is an important indicator of performance. In addition, as the data output from the semiconductor memory device are transferred more accurately, the system can operate more reliably.

FIG. 1 is a timing diagram showing a read operation of the semiconductor memory device. FIG. 1 illustrates clocks and data of a high speed semiconductor memory device, which is embodied, for example, as a DRAM connected to a GPU in a system for processing graphic data.

Referring to FIG. 1, the semiconductor memory device outputs data (DRAM DATA) corresponding to a read command of the GPU in synchronization with a rising edge and a falling edge of a memory clock (DRAM CLOCK). In addition, the GPU reads the data in synchronization with a rising edge and a falling edge of a graphic clock (GPU CLOCK). For the GPU to receive the data accurately, the rising and falling edges of the GPU clock should be within an effective window of the data output from the semiconductor memory device. The effective window is represented by 'UI' in FIG. 1.

During the data transfer, data delay DELAY may occur due to physical factors between the semiconductor memory device and the GPU. Although the semiconductor memory device outputs data in synchronization with an edge of the memory clock (DRAM CLOCK), in order to allow the GPU to receive the data accurately, the edge of the graphic clock (GPU CLOCK) should be within the effective window of the transferred data, preferably at a center of the effective window of the transferred data. Therefore, it is preferable that a phase difference between the memory clock (DRAM CLOCK) and the graphic clock (GPU CLOCK) is 0.5×UI, and a data delay is DELAY+0.5×UI. Because of the different clock environments between the semiconductor memory device and the GPU, the data being transferred are mismatched with a clock for recognizing the data, that is, a data trigger signal.

In order to solve the mismatch and provide a stable operation, a system including the semiconductor memory device predefines a delay time between the semiconductor memory device and the GPU. For example, separate reference signals such as a read strobe signal (RDQS) and a write strobe signal (WDQS) are predefined.

However, because parameters according to the definition and related information are predefined, unexpected variations of operation environments may hinder the normal data transfer in actual operation. Particularly, in a high speed system, as the effective data window becomes smaller and more data are transferred between a semiconductor memory device and a GPU, the stability of the data transfer is decreased.

Recently, a semiconductor memory device and a GPU perform data training to solve such problems and perform high speed data transfer. The data training is a technology for controlling skew between data using a predetermined training pattern between a controller and a semiconductor memory device to stably transfer data for read and write operations.

Recently proposed graphic semiconductor memory devices transfer data at a high speed over 4 Gbps, with such graphic semiconductor memory devices performing a data training to improve reliability in high speed operation.

SUMMARY OF THE INVENTION

Embodiments of the present invention are directed to providing a data transfer circuit, which has a reduced number of lines for transferring a training pattern used in a read training for high speed operation, by removing a register for temporarily storing the training pattern, and a semiconductor memory device including the data transfer circuit.

In accordance with an embodiment of the present invention, there is provided a data transfer circuit, which includes a latch unit configured to latch one bit of a training pattern data input together with a training pattern load command whenever the training pattern load command is input, and a buffer unit configured to load a plurality of bits latched in the latch unit, including the one bit of training pattern data, in response to a strobe signal.

In accordance with another embodiment of the present invention, there is provided a semiconductor memory device, which includes a data transfer circuit having a buffer unit configured to latch one bit of a training pattern data whenever a training pattern load command is input, in response to location signals, and configured to load a plurality of bits, including the one bit of latched training pattern data on the buffer unit in response to a strobe signal, a decoding circuit configured to generate location signals each indicating a location in the buffer unit, into which the training pattern data are loaded, according to a control signal, wherein the training pattern data and the control signal are input together with the training pattern load command, and a strobe signal generation circuit configured to generate a strobe signal according to the control signal.

BRIEF DESCRIPTION OF THE DRAWINGS

FIG. 7 is a timing diagram illustrating training pattern loading.

DESCRIPTION OF SPECIFIC EMBODIMENTS

Hereinafter, a data transfer circuit and a semiconductor memory device including the same in accordance with embodiments of the present invention will be described in detail with reference to the accompanying drawings.

Figure 1:
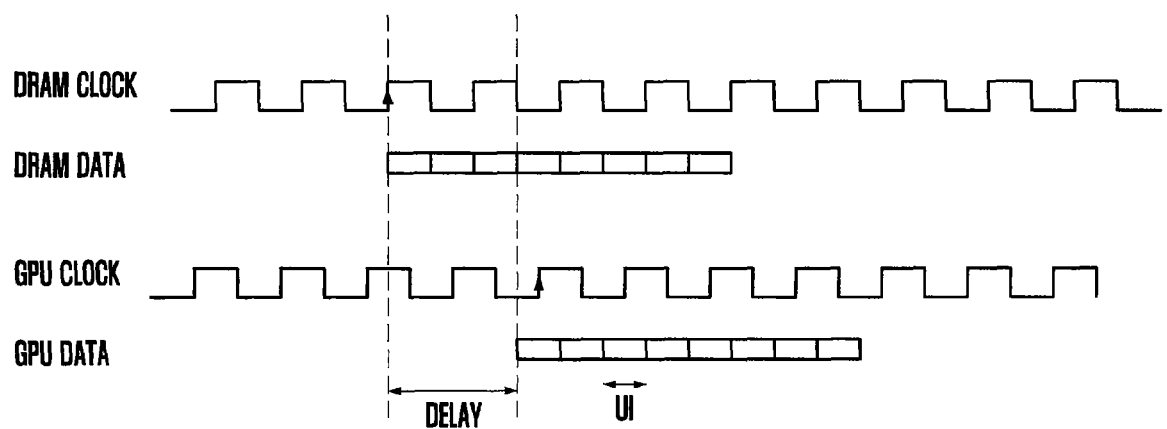
FIG. 1 is a timing diagram showing a read operation of a typical semiconductor memory device.
Figure 2:
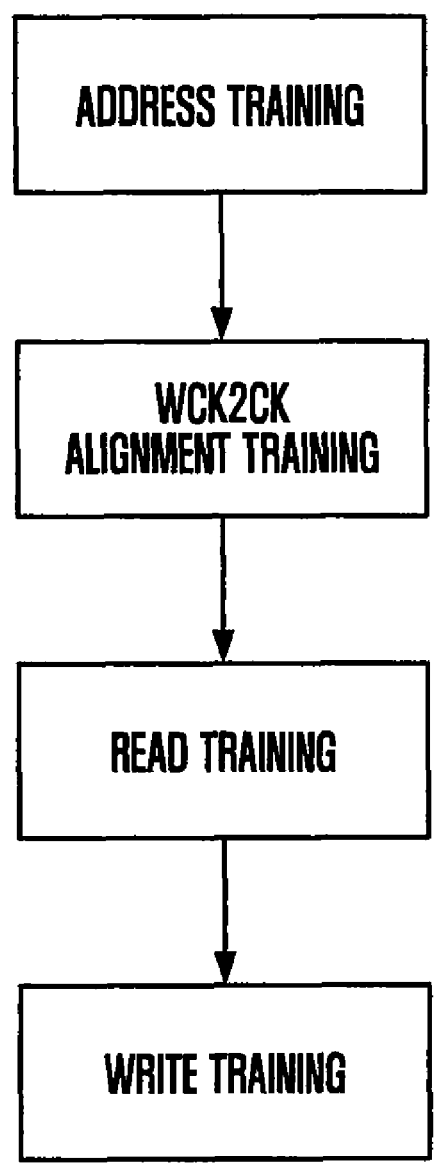
FIG. 2 is a flow diagram illustrating data training of a high speed semiconductor memory device.

FIG. 2 is a flow diagram illustrating data training of a high speed semiconductor memory device.

The semiconductor memory device performs data training to improve reliability in a high speed operation. For example, a graphic double data rate 5 (GDDR5) memory, which is a graphic semiconductor memory device, performs data training comprising a sequence of address training, clock (WCK2CK) alignment training, read training and write training, as shown in FIG. 2.

The address training is performed for aligning a host clock (HCLK) and a setup/hold time of data input through address pins of a semiconductor memory device. The semiconductor memory device receives commands, addresses, and mode register set codes through address pins, and the setup/hold time of the data input through the address pins should be aligned to transfer commands and addresses and perform mode register setting, exactly. Therefore, the address training is performed before everything. Here, the host clock (HCLK) is a clock used in transferring the commands and the addresses.

Next, clock (WCK2CK) alignment training is performed to align a data clock (WCLK) and a system clock (CLK).

Figure 3:
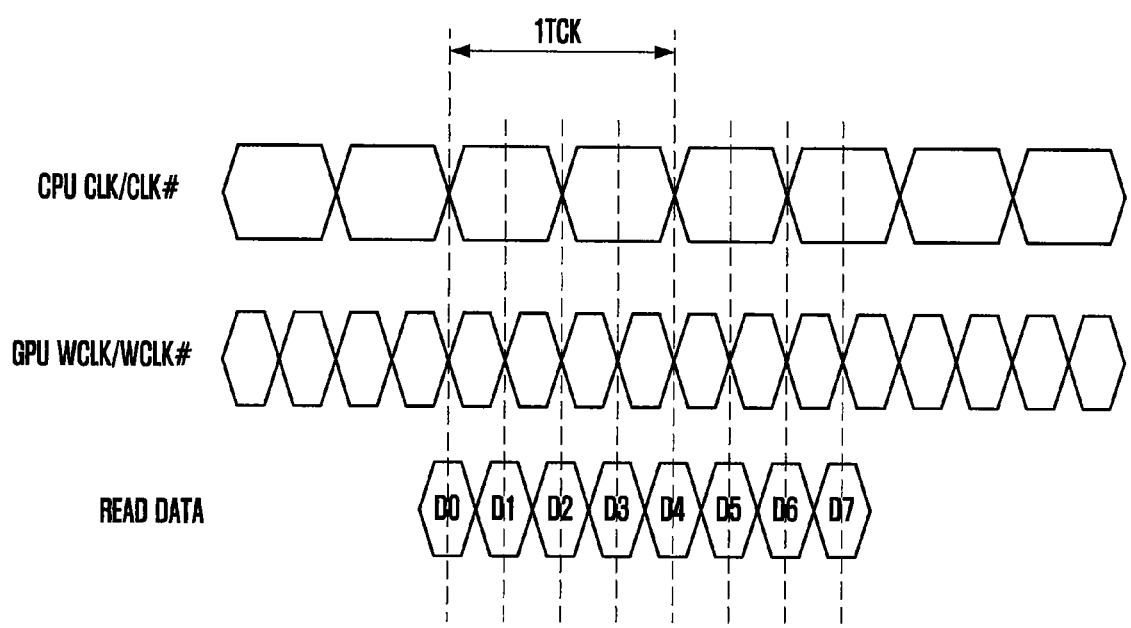
FIG. 3 is a timing diagram illustrating a data input/output operation of a high speed semiconductor memory device.

FIG. 3 is a timing diagram illustrating a data input/output operation of a high speed semiconductor memory device.

Examples of the high speed semiconductor memory device include a quad data rate (QDR) semiconductor memory device that inputs/outputs four data in one cycle (1tck) of a system clock. The QDR semiconductor memory device transfers data at a speed of 4 Gbps, which is four times as fast as that of the system clock CLK.

As illustrated in FIG. 3, a system including a semiconductor memory device and a data processor uses clocks of different frequencies. A data clock WCLK has a frequency twice that of a system clock CLK. The data clock WCLK is used as a reference in transferring data, and the system clock CLK is used as a reference in transferring commands and addresses. In a read operation, a GPU receives data D0 to D7 from the semiconductor memory device in synchronization with rising edges and falling edges of the data clock WCLK.

Since the semiconductor memory device and the GPU identify the data with respect to the rising and falling edges of the data clock WCLK, the rising and falling edges of the data clock WCLK should be within an effective window. Therefore, in the data transfer, the operation margin has a size of the effective window, for example, 0.25×tck. That is, as the operation frequency of the system clock CLK increases, it becomes increasingly difficult for the GPU to reliably receive the data. Accordingly, to ensure the high speed operation of the semiconductor memory device and the data processor, read training and write training are employed. Meanwhile, because the data clock WCLK affects the read timing, the clock (WCK2CK) alignment training is used to align the data clock WCK and the system clock CLK, prior to the read training.

Referring back to FIG. 2, after the data clock WCLK and the system clock CLK are aligned, read training is performed. Through the read training, the setup/hold time between the data clock WCLK and the data is aligned. Training data, i.e., training patterns for the read training, are input through address pins with a secured setup/hold time, and then transferred to data pins via a data input/output circuit.

After aligning the setup/hold time between the data and the data clock WCLK, the semiconductor memory device performs write training for aligning a setup/hold time of write data. In the write training, the write data input to the data pins are parallelized on the write path to be transferred through the read path. As described above, because the read path is also used in the write training, the stable read operation should be secured prior to the write training, and thus the read training is performed prior to the write training.

After aligning the setup/hold time between the data and the data clock WCLK through the read training, the read data which are output in synchronization with the system clock CLK can be identified without a DLL.

Figure 4:
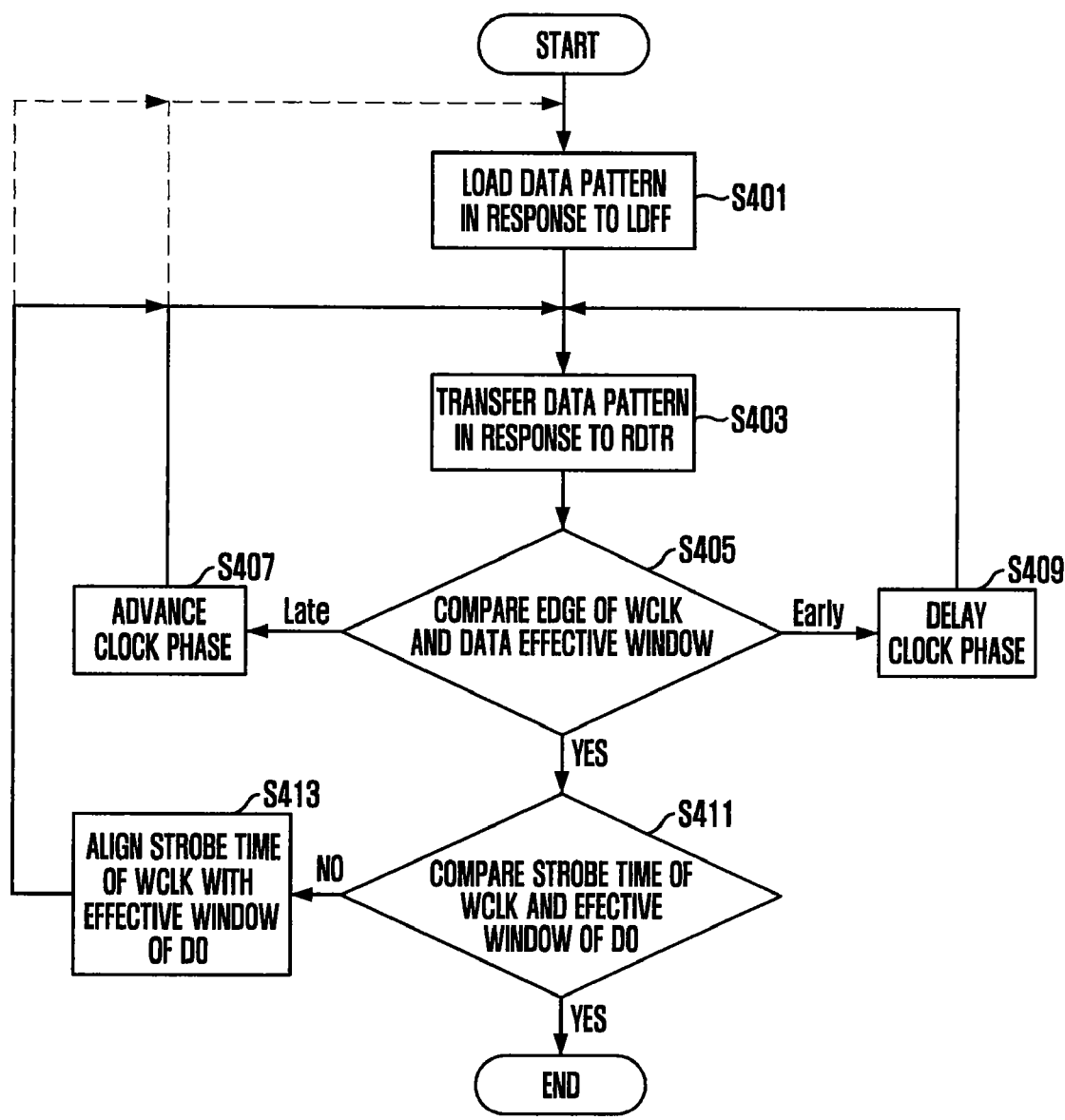
FIG. 4 is a flow diagram illustrating read training of a high speed semiconductor memory device.

FIG. 4 is a flow diagram illustrating the read training of a high speed semiconductor memory device.

The read training performed between the semiconductor memory device and a data processor includes an operation of loading a training pattern on the semiconductor memory device, and an operation of comparing the training patterns. The operation of loading the training pattern is performed according to a training pattern load command (LDFF), and the operation of reading the training pattern for the comparison is performed according to a read training command (RDTR). The operation of comparing the training patterns is performed by the GPU using the training pattern which is read according to the read training command RDTR.

Specifically, referring to FIG. 4, the read training includes operation S401 of loading a training pattern, operation S403 of transferring the training pattern, operations S405, S407 and S409 of aligning an edge of a data clock WCLK within an effective window, and operations S411 and S413 of aligning a strobe time, i.e. trigger time, of the data clock WCLK within a first effective window of the training pattern.

The operation S401 of loading the training pattern is performed by the semiconductor memory device according to the training pattern load command LDFF which is transferred from the GPU. The training pattern transferred from the GPU is loaded by the semiconductor memory device.

The operation S403 of transferring the training pattern is performed by the semiconductor memory device according to the read training command RDTR transferred from the GPU. The GPU compares the training pattern transferred to the semiconductor memory device in the operation S401 and the training pattern transferred from the semiconductor memory device, to identify an offset between the read data and the strobe.

The semiconductor memory device outputs the training pattern through a plurality of data input/output pads. Here, the plurality of data input/output pads may output the same training pattern, or different training patterns.

In the operation S405, after receiving the training pattern from the semiconductor memory device, the GPU determines whether the edge of the data clock WCLK is within the effective window. If the phase of the edge of the data clock WCLK is determined to be late, the operation S407 is performed to advance the phase. If the phase of the edge of the data clock WCLK is determined to be early, the operation S409 is performed to delay the phase. If the phase of the edge of the data clock WCLK is determined to be within the effective window, operation S411 is performed.

As the operation S403 of transferring the training pattern and the operations S405, S407 and S409 of aligning the edge of the data clock WCLK within the effective window are repeatedly performed, the edge of the data clock WCLK can be adjusted to be within the effective window. Then, in the operation S411, the GPU determines whether the strobe time of the data clock WCLK is within the first effective window of the training pattern. If the strobe time of the data clock WCLK is determined not to be within the first effective window of the training pattern, the operation S413 is performed to align the strobe time of the data clock WCLK within the first effective window of the training pattern.

Figure 5:
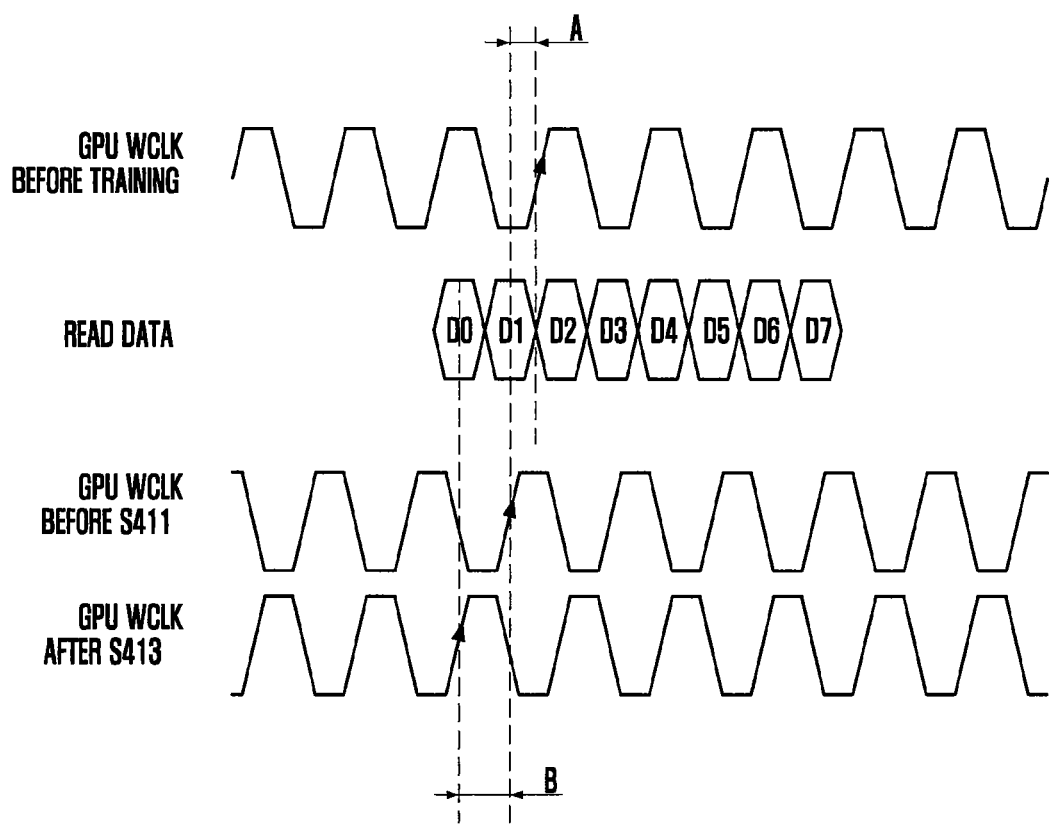
FIG. 5 is a timing diagram illustrating a result of the read training of FIG. 4.

FIG. 5 is a timing diagram illustrating a result of the read training of FIG. 4.

As shown in FIG. 5, before the read training, the edge of the data clock WCLK is not within an effective window of the training pattern data D0 to D7, and the strobe time of the data clock WCLK is not aligned with the effective window of the first training pattern data D0. Accordingly, reliable receipt of the training pattern data D0 to D7 of the GPU is not secured. Here, the time difference between the center of an effective window of the training pattern data D0 to D7 and the strobe time of the present data clock WCLK is represented by 'A'.

As the operation S403 of transferring the training pattern and the operations S405, S407 and S409 of aligning the edge of the data clock WCLK within an effective window are repeatedly performed, the phase of the data clock WCLK is corrected by an amount corresponding to the time difference A. As such, the edge of the data clock WCLK is adjusted to be within an effective window. However, the strobe time of the data clock WCLK is not yet aligned within the effective window of the first training pattern data D0. Here, the time difference between the center of the effective window of the first training pattern data D0 and the strobe time of the present data clock WCLK is represented by 'B'.

Then, as the operations S411 and S413 are performed, the strobe time of the data clock WCLK is aligned within the effective window of the first training pattern data D0. Accordingly, the GPU can receive the training pattern data D0 to D7 at half cycle intervals of the data clock WCLK.

As described above, the read training is performed according to the combination of the training pattern load command LDFF and the read training command RDTR. The semiconductor memory device loads the training pattern which is transferred through the address pins together with the training pattern load command LDFF, and outputs through the data path the training pattern according to the read training command RDTR. The loading of the training pattern according to the training pattern load command LDFF requires a circuit configuration in addition to that used for a normal read operation. This is because the training pattern received through the address pins is to be transferred through the data path.

Figure 6:
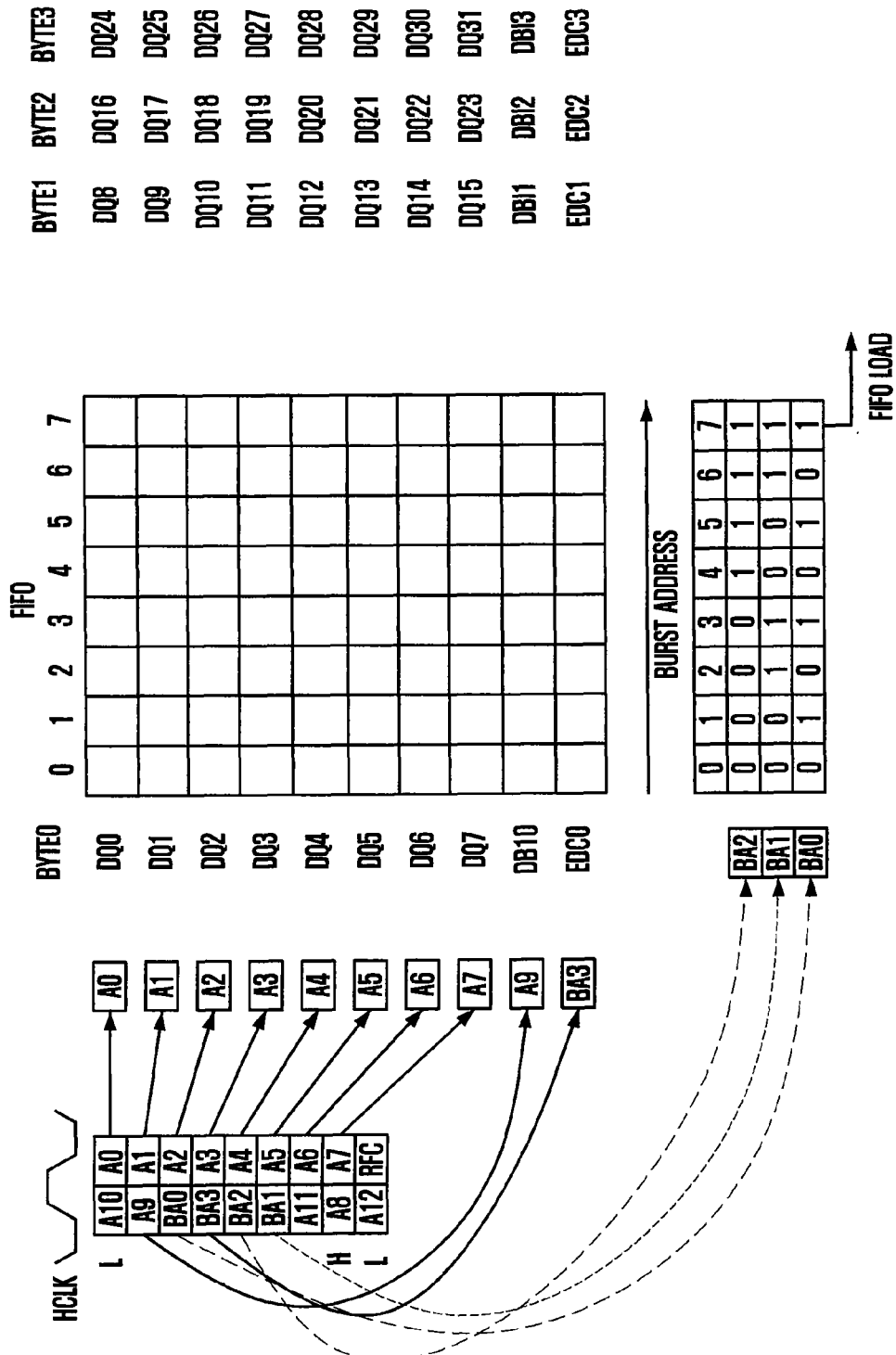
FIG. 6 is a diagram illustrating training pattern loading according to a training pattern load command (LDFF).

FIG. 6 is a diagram illustrating training pattern loading according to a training pattern load command LDFF, and FIG. 7 is a timing diagram illustrating the training pattern loading.

Referring to FIGS. 6 and 7, a training pattern for read training is input through address pins of a semiconductor memory device, together with the training pattern load command LDFF. The training pattern load command LDFF is input in synchronization with a rising edge of a host clock HCLK, and the training pattern is input in synchronization with rising and falling edges of the host clock HCLK. In FIGS. 6 and 7, the training pattern data for the read training are represented by, for example, A0 to A7, A9, and BA3, or ADD.

As described above, in the read training, the training pattern is loaded on a buffer FIFO according to the training pattern load command LDFF, and output from the buffer FIFO to data pins through a data input/output circuit according to a read training command RDTR. FIG. 6 illustrates an example of correspondence between the data transfer circuits DQ0 to DQ7, DBIO and EDCO and the buffer FIFO on which the training pattern data A0 to A7, A9 and BA3 input through the address pins are loaded. The training pattern data A0 to A7, A9 and BA3 are input through N address pins, respectively. The buffer FIFO corresponding to each of the training pattern data A0 to A7, A9 and BA3 has M-bit prefetch architecture and is included in the N data transfer circuits DQ0 to DQ7, DBIO and EDCO. The training pattern data A0 to A7, A9 and BA3 are output to the respective data pins through the buffer FIFO.

FIGS. 6 and 7 illustrate a case where a 10-bit (N=10) training pattern, including ten training pattern data corresponding to the respective data transfer circuits DQ0 to DQ7, DBIO and EDCO, is prefetched on the buffer FIFO according to eight (M=8) data pattern load commands LDFF.

A P-bit control signal input together with the training pattern, for example, a control signal represented by BA0 to BA2 (P=3) or a burst address includes information on location in the buffer FIFO, where the training pattern data are loaded. For example, in the above case, the 8-bit training pattern is mapped to be sequentially stored in the buffer FIFO of the prefetch architecture according to the 3-bit control signal which is input together with each training pattern load command LDFF. Accordingly, the training pattern data to be stored in the last location of the buffer FIFO of the prefetch architecture is input together with, for example, the control signal of [111]. Thus, the control signal of [111] indicates the completion of one prefetch stage of the buffer FIFO. The control signal indicating the last location of the buffer FIFO, for example, the control signal of [111] indicating the completion of one prefetch stage of the buffer FIFO, is referred to as a buffer load signal FIFO_LOAD.

Location signals LDFFSTBP0 to LDFFSTBP7 shown in FIG. 7 will be described below.

It will be apparent to those skilled in the art that the number (N) of the data transfer circuit through which the training pattern is transferred, the number (L) of the FIFO buffers, the number (M) of bits of the prefetch architecture, and the number (P) of bits of the control signal may be varied according to the design of the semiconductor memory device.

For example, as illustrated in FIG. 6, the training pattern data (e.g., A0) loaded on the FIFO buffer according to the training pattern load command LDFF may be transferred to four data input/output circuits BYTE 0 to BYTE 3. In this case, the number of the FIFO buffers for loading the training pattern data is 4 (L=4), corresponding to the number of the data input/output circuits BYTE0 to BYTE3. The training pattern data (e.g., A0) may be transferred through the corresponding data transfer circuits of the respective four data input/output circuits, for example, through the data transfer circuits DQ0, DQ8, DQ16 and DQ24. The FIFO buffers for loading the training pattern data (e.g., A0) are included in the data transfer circuits DQ0, DQ8, DQ16 and DQ24, respectively.

In the above description, a method for loading the training pattern data on the buffer FIFO according to the training pattern load command LDFF was described. Here, the training pattern data input to the semiconductor memory device are not directly loaded on the FIFO buffer. Instead, the training pattern data are temporarily stored in a temporary register and loaded on the FIFO buffer at a time.

Figure 8:
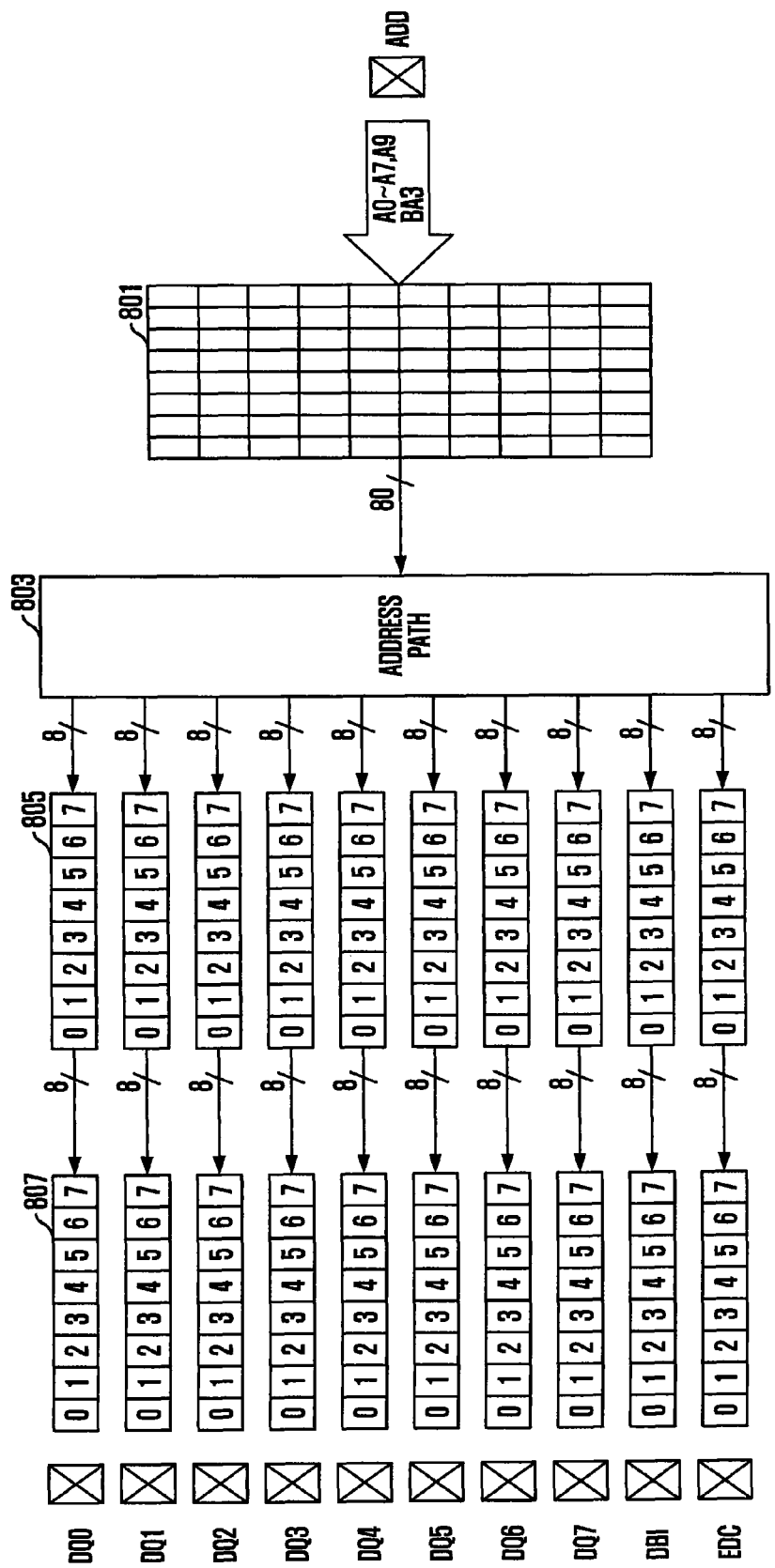
FIG. 8 is a diagram illustrating an operation of training pattern loading.

FIG. 8 is a diagram illustrating an operation of training pattern loading.

Referring to FIG. 8, the circuit for loading the training pattern includes a temporary register 801, an address path 803, a latch unit 805 and a buffer unit 807.

Training pattern data A0 to A7, A9 and BA3 of the training pattern are input through address pins, and temporarily stored in the temporary register 801. Such a storage process is repeated until a buffer load signal FIFO_LOAD is input. Therefore, the required size of the temporary register 801 is N×M bits, for example 10×8 in FIG. 8.

As the buffer load signal FIFO_LOAD is input, the N×M training pattern data stored in the temporary register 801 are simultaneously transferred to the latch units 805 through the N×M address paths 803. Then, the training pattern data transferred to the latch units 805 are loaded on the respective buffer units 807 of the data transfer circuits DQ0 to DQ7, DBI0 and EDC0. The number of the latch units 805 and the number of the buffer units 807 are N (e.g., 10 in FIG. 8), which corresponds to the number of the data transfer circuits DQ0 to DQ7, DBI0 and EDC0 through which the training pattern data are transferred. The bit size of each of the latch units 805 and the buffer units 807 is M (e.g., 8 in FIG. 8). It corresponds to the bit number of the training pattern data which are input together with M training pattern load commands LDFF and prefetched on the buffer FIFO along each of the data transfer circuits DQ0 to DQ7, DBI0 and EDC0 until the buffer load signal FIFO_LOAD is input.

As described above, the training pattern data are temporarily stored in the temporary register 801 until the buffer load signal FIFO_LOAD is input, and transferred to the latch units 805 through the N×M address paths 803 at a time. Here, the N×M address paths 803 between the temporary registers 801 and the latch units 805 are quite long, and take a large portion of a chip size.

An exemplary embodiment of the present invention provides a semiconductor memory device having a simple configuration where the temporary register (801 in FIG. 8) is not included and the number of the address paths (803 in FIG. 8) between the temporary registers (801 in FIG. 8) and the latch units (805 in FIG. 8) is reduced to N×1.

Figure 9:
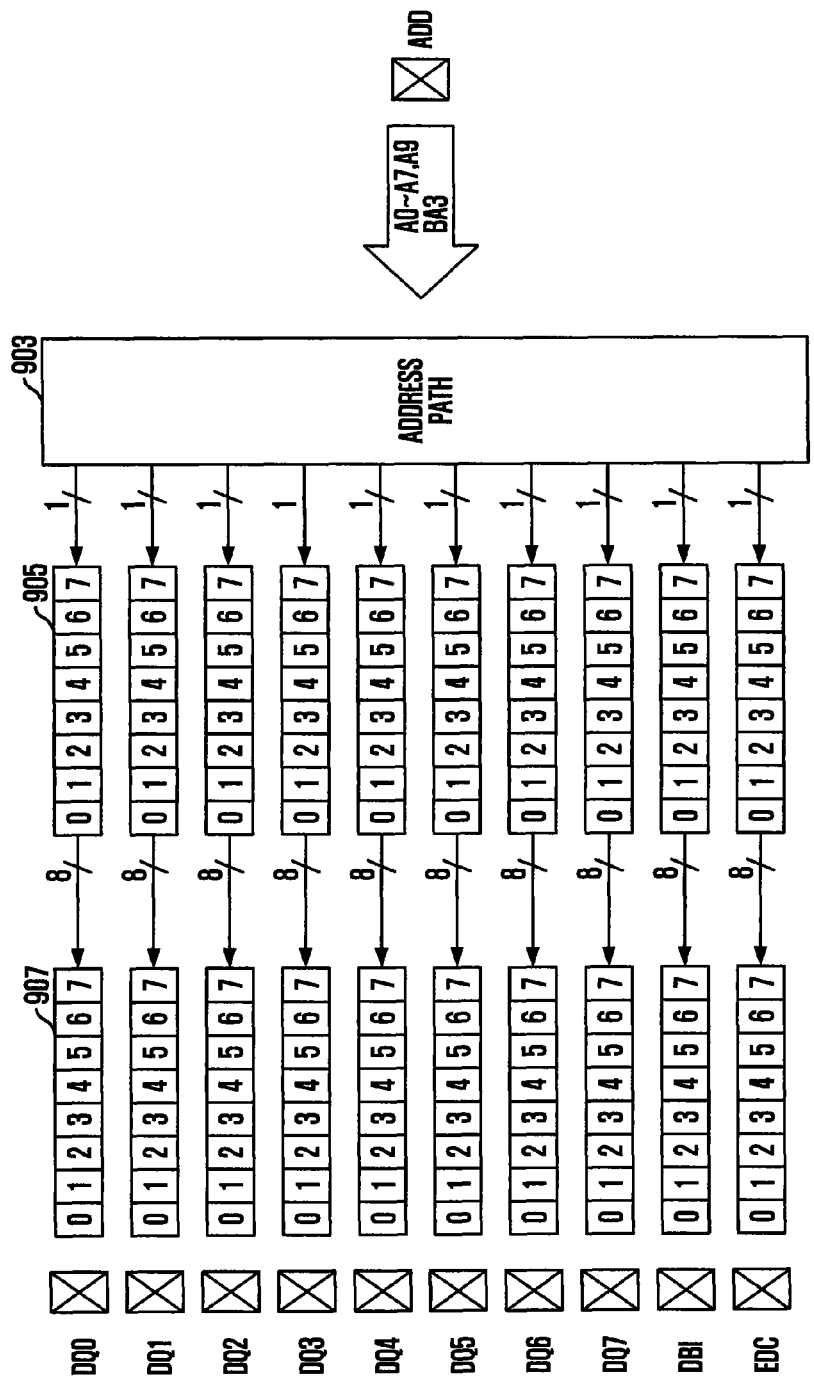
FIG. 9 is a diagram illustrating an operation of training pattern loading of a semiconductor memory device in accordance with an embodiment of the present invention.

FIG. 9 is a diagram illustrating an operation of training pattern loading of a semiconductor memory device in accordance with the embodiment of the present invention.

Referring to FIG. 9, a circuit for loading the training pattern of the semiconductor memory device includes an address path 903, a latch unit 905 and a buffer unit 907. In the embodiment, the training pattern input to the semiconductor memory device is not directly loaded on the buffer unit 907, as described above.

However, in the semiconductor memory device in accordance with the embodiment, the temporary register (801 in FIG. 8) is not required, and the number of the address paths 903 is N×1. For each of the data transfer circuits DQ0 to DQ7, DBI0 and EDC0, a 1-bit training pattern data, which is input together with each training pattern load command LDFF, is directly transferred to the latch unit 905. Such a transfer process is repeated until the buffer load signal FIFO_LOAD is input. As the buffer load signal FIFO_LOAD is input, the training pattern data transferred to the latch unit 905 is loaded on the buffer units 907.

As described above, whenever the training pattern load command LDFF is input, the 1-bit training pattern data, input together with the training pattern load command LDFF, is directly transferred to the latch unit 905. Accordingly, there is no need for the temporary register 801, and the N×M address paths 803 is reduced to the N×1 address paths 903. This results in a semiconductor memory device having a simpler configuration.

Figure 10:
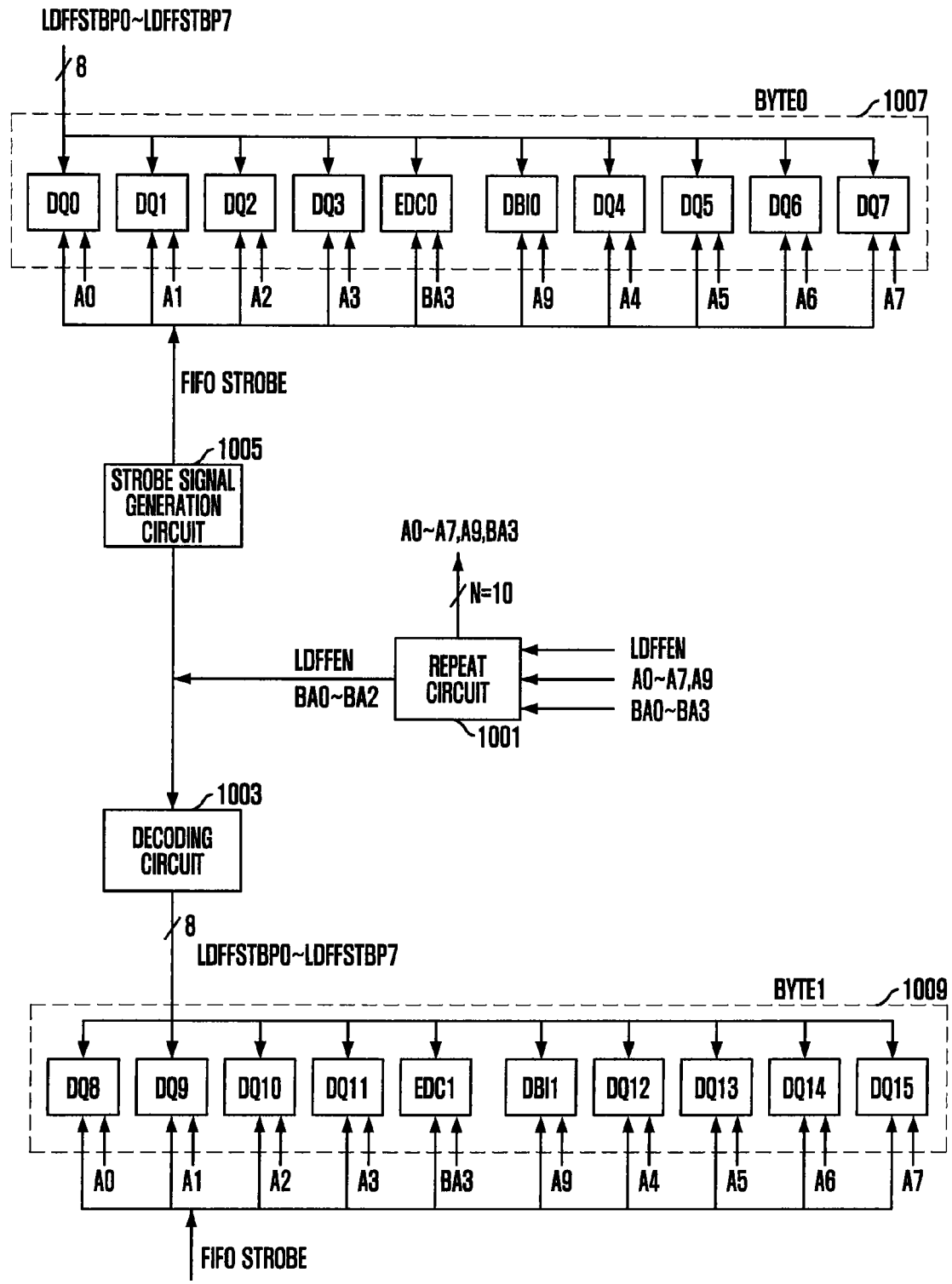
FIG. 10 is a block diagram illustrating a semiconductor memory device in accordance with an embodiment of the present invention.

FIG. 10 is a block diagram illustrating a semiconductor memory device in accordance with an embodiment of the present invention.

Referring to FIG. 10, the semiconductor memory device includes a repeat circuit 1001, a decoding circuit 1003, a strobe signal generation circuit 1005 and data input/output circuits 1007 and 1009. FIG. 10 illustrates the case where two data input/output circuits 1007 and 1009 together include 16 data transfer circuits DQ0 to DQ15, two data bus inversion circuits DBI0 and DBI1, and two error detection code circuits EDC0 and EDC1. Here, one training pattern data (e.g., A0) may be transferred to the corresponding data transfer circuits (e.g., DQ0 and DQ8) of the respective data input/output circuits 1007 and 1009.

The data transfer circuits DQ0 to DQ15, the data bus inversion circuits DBI0 and DBI1, and the error detection code circuits EDC0 and EDC1 all have the same configuration. Accordingly, they may each be commonly referred to as a data transfer circuit. The buffer units 907 are included in the data transfer circuits DQ0 to DQ15, DBI0, EDC0, DBI1 and EDC1, respectively. It is apparent that a semiconductor memory device including four data input/output circuits, for example, can be easily designed by those skilled in the art based on the above described embodiment of the present invention.

For reference, the data bus inversion circuits DBI0 and DBI1 generally output data bus inversion (DBI) information indicating whether the data output from the semiconductor memory device are inverted data or not. The error detection code circuits EDC0 and EDC1 generally output an error detection code, which is a continuously toggling signal. Because they are defined by Joint Electron Device Engineering Council (JEDEC) for the high speed memory device, a detailed description thereof will be omitted herein.

The repeat circuit 1001 divides a pulse signal LDFFEN generated according to the training pattern load command LDFF, the training pattern data A0 to A7, A9 and BA3 input through the address pins, and the control signals BA0 to BA2. That is, the training pattern data A0 to A7, A9 and BA3 are transferred to the data transfer circuits DQ0 to DQ7, DBI0 and EDC0 of the data input/output circuit 1007, and the data transfer circuits DQ8 to DQ15, DBI1 and EDC1 of the data input/output circuit 1009, respectively. The pulse signal LDFFEN and the control signals BA0 to BA2 are transferred to the decoding circuit 1003 and the strobe signal generation circuit 1005. Referring to FIG. 10, the data input/output circuits 1007 and 1009 each receive the same training pattern data A0 to A7, A9 and BA3 from the repeat circuit 1001.

The decoding circuit 1003 receives the pulse signal LDFFEN and the control signals BA0 to BA2 from the repeat circuit 1001 to generate location signals LDFFSTBP0 to LDFFSTBP7. The data transfer circuits DQ0 to DQ15, DBI0, EDC0, DBI1 and EDC1 receive the location signal LDFF-STBP0 to LDFFSTBP7 to load the corresponding training pattern data A0 to A7, A9 and BA3 on predetermined locations of the buffer unit (907 in FIG. 9).

The strobe signal generation circuit 1005 receives the pulse signal LDFFEN and the control signals BA0 to BA2 from the repeat circuit 1001 to generate a strobe signal FIFO_STROBE. The data transfer circuits DQ0 to DQ15, DBI0, EDC0, DBI1 and EDC1 receive the strobe signal FIFO_STROBE to transfer the training pattern data A0 to A7, A9 and BA3 from the latch unit 905 to the buffer unit 907.

Figure 11:
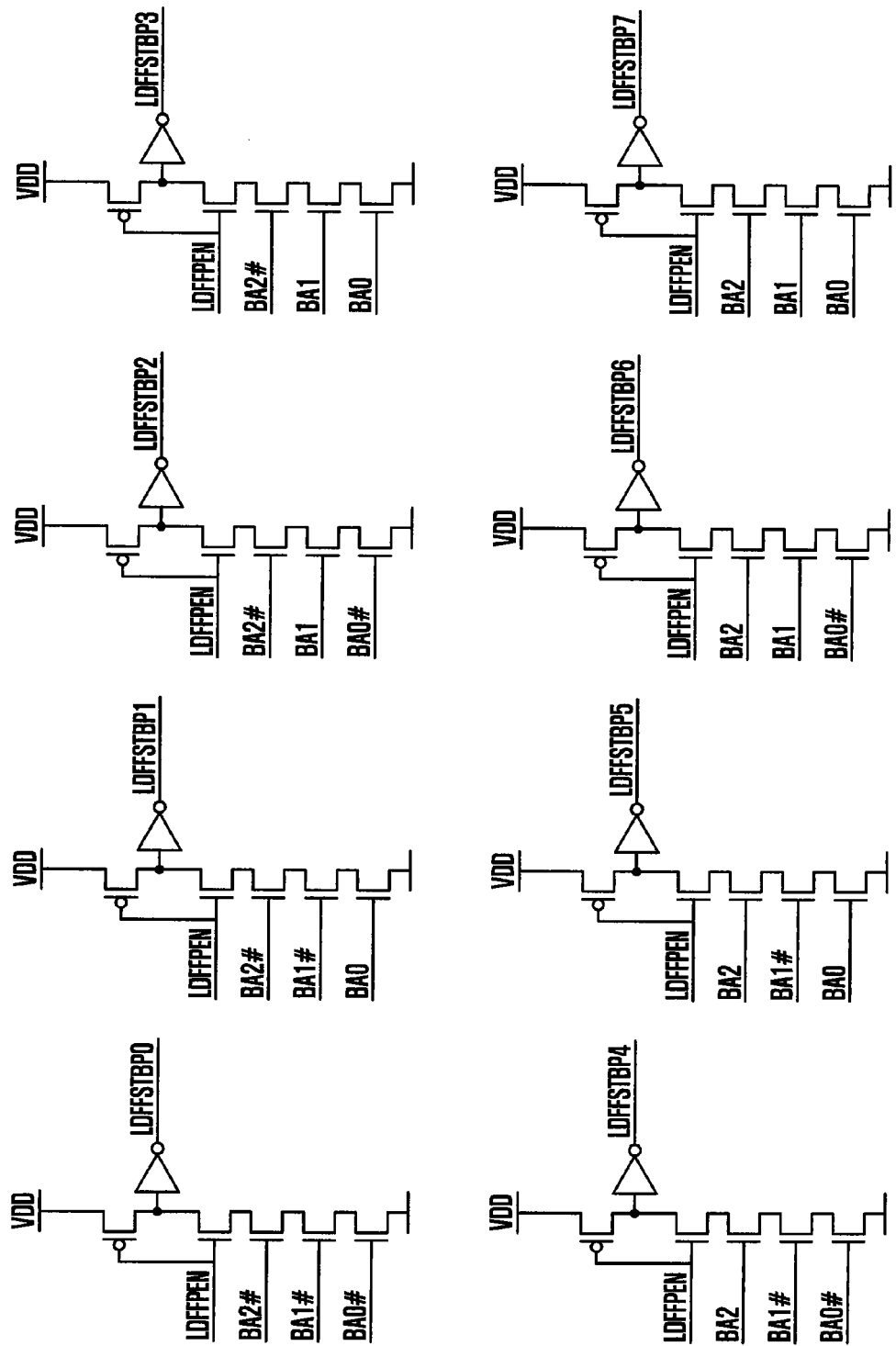
FIG. 11 is a circuit diagram illustrating a decoding circuit shown in FIG. 10.

FIG. 11 is a circuit diagram illustrating the decoding circuit 1003 shown in FIG. 10.

Referring to FIG. 11, the decoding circuit 1003 includes location signal generation units configured to respectively generate location signals LDFFSTBP0 to LDFFSTBP7 in response to control signals BA0 to BA2 and a pulse signal LDFFEN output from the repeat circuit 1001. As one embodiment, each of the location signal generation unit includes a PMOS transistor configured to receive the pulse signal LDFFEN, and an NMOS transistor configured to receive the pulse signal LDFFEN and positive or negative control signals BA0 to BA2 or BA0# to BA2#. Here, the PMOS and NMOS transistors are connected in series. An inverter is connected to a drain of the PMOS transistor, and the location signals LDFFSTBP0 to LDFFSTBP7 are output through the inverter.

The pulse signal LDFFEN controls the location signals LDFFSTBP0 to LDFFSTBP7 to be deactivated. That is, when the PMOS transistor is turned on in response to the pulse signal LDFFEN of a logic low level, all the location signals LDFFSTBP0 to LDFFSTBP7 are deactivated to a logic low level. When the pulse signal LDFFEN is activated to a logic high level, the location signals LDFFSTBP0 to LDFF-STBP7 are activated by the combination of the positive or negative control signals BA0 to BA2 or BA0# to BA2#. For example, the negative control signals BA0# to BA2# may be input to the location signal generation unit that generates the location signal LDFFSTBP0. When all of the negative control signals BA0# to BA2# are input to the respective NMOS transistors with a logic high level, the location signal LDFF-STBP0 is activated to a logic high level. In this case, the other location signals LDFFSTBP1 to LDFFSTBP7 are deactivated to a logic low level.

In summary, the respective location signal generation units illustrated in FIG. 11 exclusively activate the location signals LDFFSTBP0 to LDFFSTBP7 corresponding to respective locations of the buffer unit 907 where the training pattern data A0 to A7, A9 and BA3 are to be stored. An activation timing of each of the location signals LDFFSTBP0 to LDFFSTBP7 is shown in FIG. 7.

Figure 12:
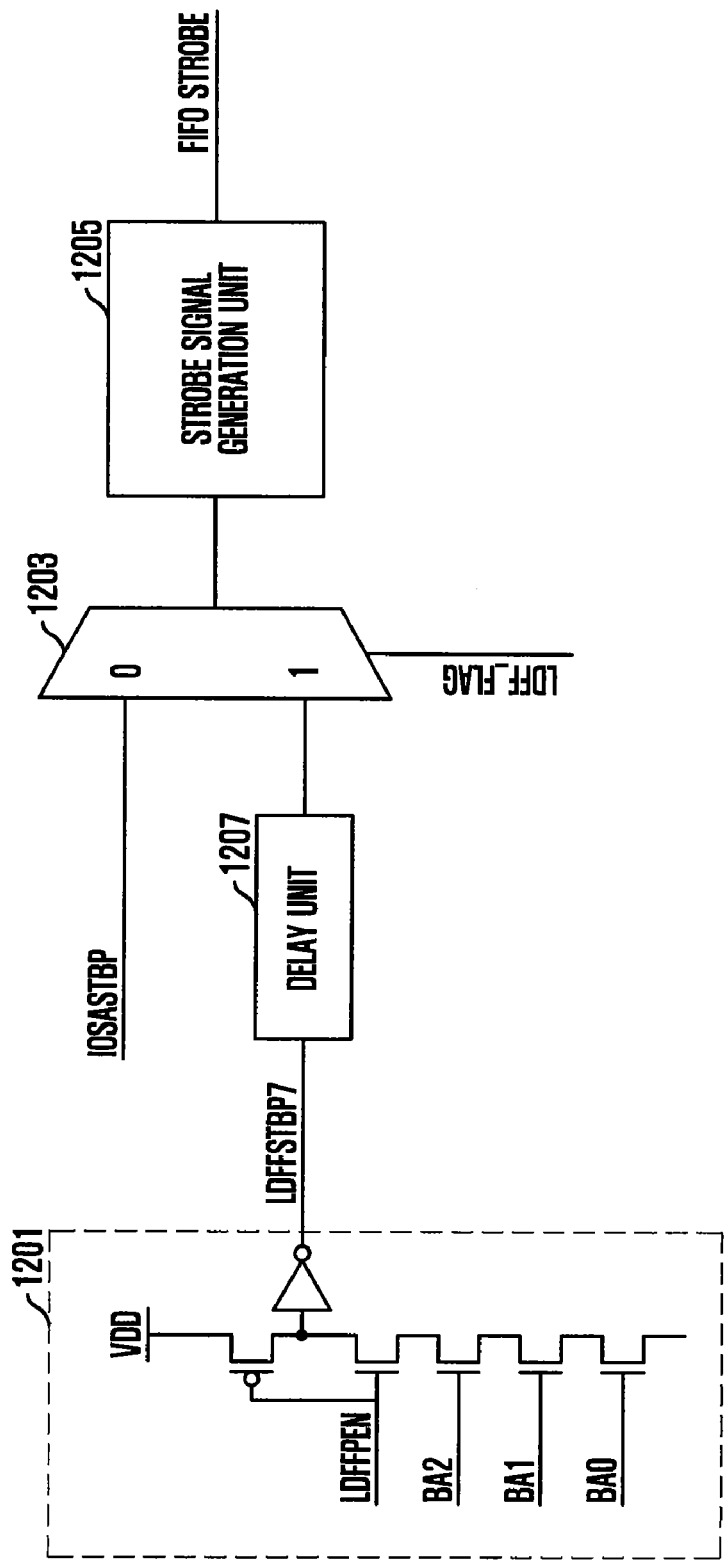
FIG. 12 is a circuit diagram illustrating a strobe signal generation circuit shown in FIG. 10.

FIG. 12 is a circuit diagram illustrating the strobe signal generation circuit 1005 shown in FIG. 10.

Referring to FIG. 12, the strobe signal generation circuit 1005 includes a location signal generation unit 1201, a first multiplexer unit 1203, a strobe signal generation unit 1205, and a delay unit 1207.

The location signal generation unit 1201 generates the location signal LDFFSTBP7 corresponding to the last storage location of the buffer unit 907.

The first multiplexer unit 1203 selects one of the location signal LDFFSTBP7 and a read strobe pulse ISOSTBA in response to a data loading flag signal LDFF_FLAG. The read strobe pulse ISOSTBA is a control signal for transferring data output from a unit cell to an output terminal of a data input/output circuit during a normal read operation of a semiconductor memory device. The data loading flag signal LDFF_FLAG is activated during a read training operation. That is, the first multiplexer unit 1203 outputs the read strobe pulse ISOSTBA while the semiconductor memory device performs a normal read operation, and outputs the location signal LDFFSTBP7 during a read training operation.

The strobe signal generation unit 1205 is responsive to an output of the first multiplexer unit 1203 to generate a strobe signal FIFO_STROBE that is activated for a predetermined time. An activation period of the strobe signal FIFO_S-TROBE is determined according to the operating environment of the semiconductor memory device.

The delay unit 1207 delays the location signal LDFF-STBP7 output from the location signal generation unit 1201 by a predetermined delay time, and then transfers the delayed location signal to the first multiplexer unit 1203. The location signal LDFFSTBP7 corresponding to the last storage location of the buffer unit 907 is generated in response to the control signals BA0 to BA2, i.e., a buffer load signal FIFO_LOAD. According to the embodiments of the present invention, the training pattern data are latched in the latch unit 905 until the buffer load signal FIFO_LOAD is input, and the training pattern data latched by the latch unit 905 are loaded into the buffer unit 907 when the buffer load signal FIFO_LOAD is input. The loading of the training pattern data into the buffer unit 907 should be performed after the last data of the corresponding training pattern is stored in the latch unit 905 according to the buffer load signal FIFO_LOAD. Therefore, to perform the loading of the training pattern data into the buffer unit 907 after the lapse of a predetermined time, the delay unit 1207 is provided in the strobe signal generation circuit 1005. Resultantly, the strobe signal FIFO_STROBE is activated after the last data of the corresponding training pattern is stored in the latch unit 905 according to the buffer load signal FIFO_LOAD.

Activation timings of the location signal LDFFSTBP7 and the strobe signal FIFO_STROBE are shown in FIG. 7.

Figure 13:
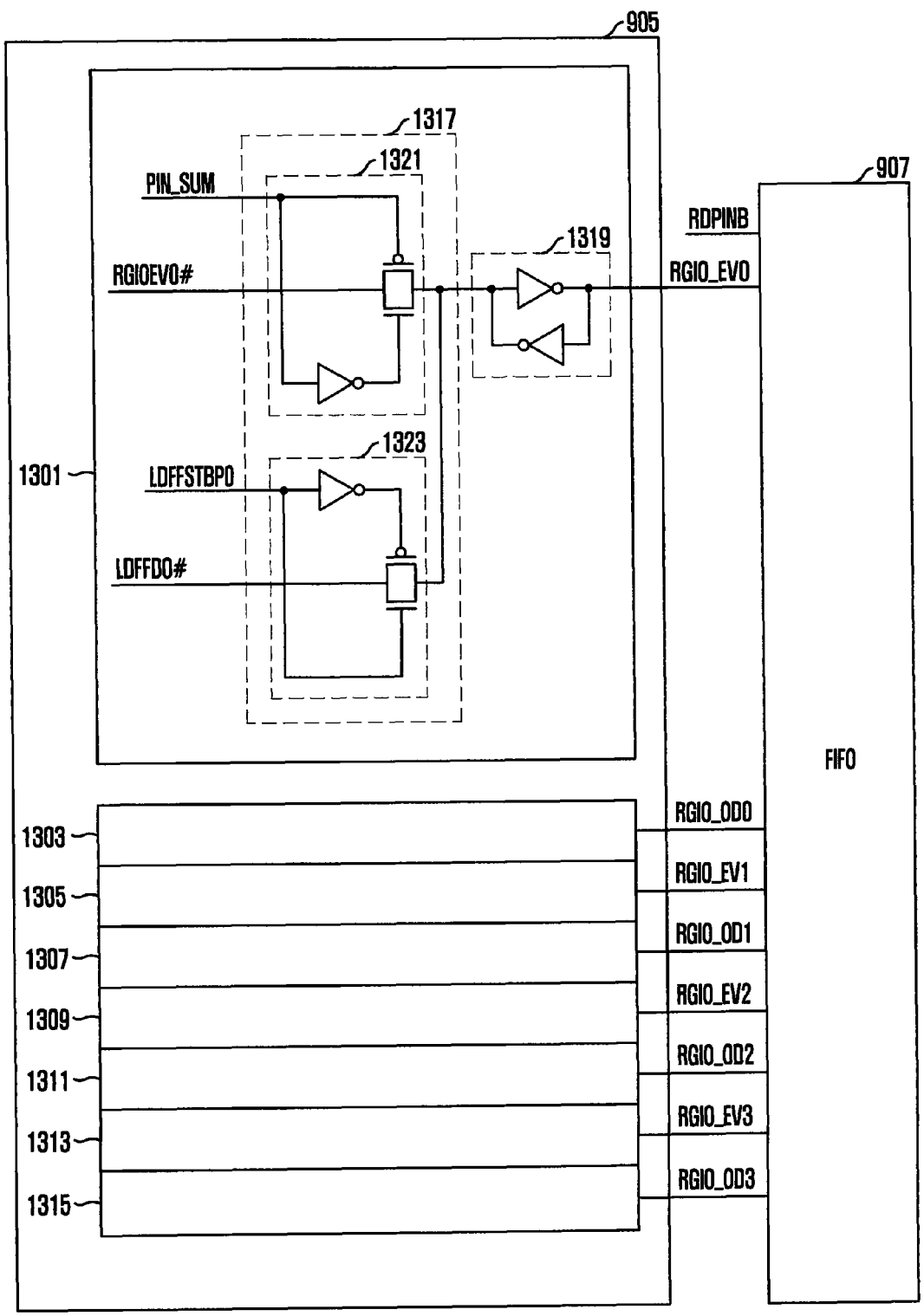
FIG. 13 is a block diagram illustrating a latch unit and a buffer unit shown in FIG. 9.

FIG. 13 is a block diagram illustrating the latch unit 905 and the buffer unit 907 shown in FIG. 9. For example, FIG. 13 illustrates the latch unit 905 and the buffer unit 907 included in each of the data transfer circuits DQ0 to DQ15, DBI0, DBI1, EDC0 and EDC1 shown in FIGS. 9 and 10.

Eight latches 1301 to 1315 constituting the latch unit 905 of FIG. 13 correspond to the respective latches numbered consecutively "0" to "7" in the latch unit 905 of the embodiment of FIG. 9. The eight latches 1301 to 1315 of FIG. 13 have the same configuration, but the location signals LDFFSTBP0 to LDFFSTBP7 corresponding to the respective locations of the buffer unit 907, in which 8-bit training pattern data prefetched into the respective latches 1301 to 1315 (for example, the 8-bit training pattern data A0 prefetched into the buffer unit 907 of the data transfer circuit DQ0) are stored, are respectively input to the latches 1301 to 1315.

The latches 1301 to 1315 respectively transfer data RGIOEV0 to RGIOEV3 and RGIOOD0 to RGIOOD3 read from cells during a normal read operation to predetermined locations RGIO_EV0 to RGIO_EV3 and RGIO_OD0 to RGIO_OD3 of the buffer unit 907.

The 8-bit training pattern data prefetched into the respective latches 1301 to 1315, for example, 8-bit training pattern data A0 prefetched into the buffer unit 907 of the data transfer circuit DQ0, are symbolized by 'LDFFD0' in FIG. 13. Specifically, a negative training pattern data LDFFD0# is stored in the latches 1301 to 1305.

For example, the latch 1301 includes an inverter latch 1319 configured to temporarily store the negative training pattern data LDFFD0#. The inverter latch 1319 temporarily stores the training pattern data LDFFD0# or the normal read data RGIOEV0#, which is selectively output from a second multiplexer unit 1317.

The second multiplexer unit 1317 selectively transfers the training pattern data LDFFD0# or the normal read data RGIOEV0# to the inverter latch 1319 according to the location signal LDFFSTBP0 and a read data transfer control signal PIN_SUM. The read data transfer control signal PIN_SUM maintains a logic high level while the training pattern is loaded.

The second multiplexer unit 1317 includes two transmission gates 1321 and 1323.

A first transmission gate 1321 includes an inverter connected to a gate of an NMOS transistor, and transfers the read data RGIOEV0# to the inverter latch 1319 in response to the read data transfer control signal PIN_SUM. The read data RGIOEV0# is not transferred during the training pattern loading period when the read data transfer control signal PIN_SUM maintains a logic high level.

The second transmission gate 1323 includes an inverter connected to a gate of a PMOS transistor, and transfers the training pattern data LDFFD0# to the inverter latch 1319 in response to the location signal LDFFSTBP0. While the location signal LDFFSTBP0 is at a logic high level, the training pattern data LDFFD0# is transferred to the inverter latch 1319 to be temporarily stored, and transferred to a corresponding location (e.g., RGIO_EV0) of the buffer unit 907.

Each of the two transmission gates 1321 and 1323 included in the second multiplexer unit 1317 and the inverter latch 1319 constitute a latch. That is, the training pattern data A0 to A7, A9 and BA13 are transferred to the respective locations RGIO_EV0 to RGIO_EV3 and RGIO_OD0 to RGIO_OD3 of the buffer unit 907 by the location signals LDFFSTBP0 to LLDFFSTBP7 selectively activated together with the read data transfer control signal PIN_SUM. For example, the buffer unit 907 may include a latch in each of the storage locations RGIO_EV0 to RGIO_EV3 and RGIO_OD0 to RGIO_OD3. The latch included in the buffer unit 907 constitutes a flip-flop together with the transmission gate 1323 and the inverter latch 1319. The latch of the buffer unit 907 latches the respective training pattern data A0 to A7, A9 and BA13 transferred from the latches 1301 to 1315 in response to a control signal RDPINB activated according to the strobe signal FIFO_STROBE.

Consequently, the buffer unit 907 loads the training pattern through the latch unit 905 configured to prefetch the training pattern data A0 to A7, A9 and BA13 by one bit whenever the training pattern load command LDFF is input. The training pattern loaded into the buffer unit 907 is output to a data pin through the data transfer circuit (e.g., DQ0 to DQ15, DBI0, DBI1, EDC0 and EDC1).

In accordance with the present invention, the data transfer circuit reduces the number of lines for transferring a training pattern used in a read training for high speed operation without a register for temporarily storing the training pattern. Therefore, a data transfer circuit with a simple configuration and a semiconductor memory device including the data transfer circuit can be provided.

While the present invention has been described with respect to the specific embodiments, it will be apparent to those skilled in the art that various changes and modifications may be made without departing from the spirit and scope of the invention as defined in the following claims.

What is claimed is:

1. A data transfer circuit, comprising:
   a latch unit configured to latch one bit of a training pattern data input together with a training pattern load command whenever the training pattern load command is input; and
   a buffer unit configured to load a plurality of bits latched in the latch unit, including the one bit of training pattern data, in response to a strobe signal.

2. The data transfer circuit as recited in claim 1, wherein the strobe signal is activated in response to a buffer load signal, input together with the training pattern load command, indicating completion of one prefetch stage of the buffer unit.

3. The data transfer circuit as recited in claim 1, wherein the latch unit includes a first latch configured to latch the training pattern data according to a location signal generated based on a control signal, wherein the control signal is input together with the training pattern load command and indicates a location in the buffer unit into which the training pattern data are loaded.

4. The data transfer circuit as recited in claim 3, wherein the first latch includes:
   a first transmission gate configured to transfer the training pattern data when the location signal is activated; and
   an inverter latch configured to latch the training pattern data transferred through the first transmission gate.

5. The data transfer circuit as recited in claim 4, wherein the first latch further includes a second transmission gate configured to transfer a normal read data when a read data transfer control signal is deactivated, the read data transfer control signal being activated to a logic high level during a read training period of the data transfer circuit, wherein the first transmission gate and the second transmission gate are connected in parallel to an input terminal of the inverter latch.

6. The data transfer circuit as recited in claim 3, wherein the buffer unit includes a second latch corresponding to the first latch of the latch unit, the second latch configured to latch the training pattern data transferred from the first latch according to the strobe signal.

7. The data transfer circuit as recited in claim 1, wherein the latch unit includes latches of a number corresponding to a prefetch architecture of the buffer unit.

8. The data transfer circuit as recited in claim 1, wherein the buffer unit has an 8-bit prefetch architecture.

9. A semiconductor memory device, comprising:
   a data transfer circuit having a buffer unit configured to latch one bit of a training pattern data whenever a training pattern load command is input, in response to location signals, and configured to load a plurality of bits, including the one bit of latched training pattern data, on the buffer unit in response to a strobe signal;
   a decoding circuit configured to generate location signals each indicating a location in the buffer unit, into which the training pattern data are loaded, according to a control signal, wherein the training pattern data and the control signal are input together with the training pattern load command; and
   a strobe signal generation circuit configured to generate a strobe signal according to the control signal.

10. The semiconductor memory device as recited in claim 9, wherein the strobe signal generation circuit activates the strobe signal in response to a buffer load signal, which is the control signal indicating completion of one prefetch stage of the buffer unit.

11. The semiconductor memory device as recited in claim 10, wherein the strobe signal generation circuit includes:
- a first location signal generation unit configured to generate a first location signal indicating a location in the buffer unit for loading the training pattern data in response to the buffer load signal; and
- a strobe signal generation unit configured to generate the strobe signal according to the first location signal.

12. The semiconductor memory device as recited in claim 11, wherein the strobe signal generation circuit further includes a first multiplexer unit configured to selectively transfer one of the first location signal and a read strobe pulse signal, and connected to an input terminal of the strobe signal generation unit.

13. The semiconductor memory device as recited in claim 12, wherein the strobe signal generation circuit further includes a delay unit configured to delay the first location signal by a predetermined time to transfer a delayed first location signal to the first multiplexer.

14. The semiconductor memory device as recited in claim 9, wherein the decoding circuit includes a plurality of location signal generation units configured to activate the location signals in response to the control signal.

15. The semiconductor memory device as recited in claim 9, wherein the data transfer circuit further includes a latch unit configured to latch one bit of the training pattern data whenever the training pattern load command is input, in response to the location signals, wherein the buffer unit loads the training pattern data latched in the latch unit in response to the strobe signal.

16. The semiconductor memory device as recited in claim 15, wherein the latch unit includes a plurality of first latches each including:
- a first transmission gate configured to transfer the training pattern data when a respective location signal is activated; and
- an inverter latch configured to latch the training pattern data transferred through the first transmission gate.

17. The semiconductor memory device as recited in claim 16, wherein each of the first latches further includes a second transmission gate configured to transfer a normal read data when a read data transfer control signal is deactivated, the read data transfer control signal being activated to a logic high level during a read training period of the semiconductor memory device, wherein the first transmission gate and the second transmission gate are connected in parallel to an input terminal of the inverter latch.

18. The semiconductor memory device as recited in claim 15, wherein the buffer unit includes second latches corresponding to the first latches of the latch unit, the second latch configured to latch the training pattern data transferred from the first latches according to the strobe signal.

19. The semiconductor memory device as recited in claim 15, wherein the latch unit includes latches of a number corresponding to a prefetch architecture of the buffer unit.

20. The semiconductor memory device as recited in claim 9, further including a plurality of data transfer circuits to correspond to bits of the training pattern data which are input together with the training pattern load command.

21. The semiconductor memory device as recited in claim 9, further including:
- a repeat circuit configured to reproduce the training pattern data input together with the training pattern load command; and
- a plurality of data transfer circuits configured to correspond to bits of the training pattern data reproduced by the repeat circuit.

* * * * *